United States Patent [19]
Donnelly

[11] 3,967,252
[45] June 29, 1976

[54] SENSE AMP FOR RANDOM ACCESS MEMORY

[75] Inventor: Robert Murray Donnelly, Carrollton, Tex.

[73] Assignee: Mostek Corporation, Carrollton, Tex.

[22] Filed: Oct. 3, 1974

[21] Appl. No.: 511,572

[52] U.S. Cl. .................... 340/173 R; 340/173 FF; 340/173 CA
[51] Int. Cl.² .................. G11C 7/06; G11C 11/24; G11C 11/40
[58] Field of Search.... 340/173 R, 173 CA, 173 FF; 307/238

[56] References Cited
UNITED STATES PATENTS

| | | |
|---|---|---|
| 3,714,638 | 1/1973 | Dingwall et al. .............. 340/173 FF |
| 3,747,077 | 7/1973 | Goser ............................ 340/173 FF |
| 3,760,381 | 9/1973 | Yao ............................... 340/173 CA |
| 3,806,898 | 4/1974 | Askin ............................ 340/173 CA |
| 3,868,656 | 2/1975 | Stein et al. .................... 340/173 FF |

*Primary Examiner*—Stuart N. Hecker
*Attorney, Agent, or Firm*—Hubbard, Thurman, Turner & Tucker

[57] ABSTRACT

A MOSFET random access memory having a highly sensitive sense amplifier is disclosed. The sense amplifier utilizes a field effect transistor connected in the common gate mode so as to produce a large output swing on a relatively low capacitance output node, which is the drain node of the transistor, as a result of a relatively low voltage swing produced by reading data stored in a memory cell on a high capacitance column bus connected to the source of the transistor. The sense amplifier is shown in differential configuration with a low power level shifting circuit and also with both static memory cells, where a greatly improved access time is produced, and with destructive readout cells where improved reliability is possible.

15 Claims, 2 Drawing Figures

SENSE AMP FOR RANDOM ACCESS MEMORY

The present invention is concerned with random access memories of the type fabricated on a single monolithic semiconductor chip using metal-insulator-semiconductor field effect transistors (MISFET) technology, and more particularly relates to sense amplifiers and associated circuitry for reading data from the memory cells of such systems.

One of the most important attributes of a randon access memory system is a short access time to stored data. This is particularly difficult to achieve in large scale MISFET integrated circuits because of the capacitance of various nodes of the integrated circuits in structures produced by the simpler fabrication technologies. In the design of a random access memory, it is common to array a large number of memory cells in a matrix of rows and columns. Data is typically transferred to and from the memory cells of a column by means of a single electrical conductor, often referred to as a column bus. A specific cell of all of those connected to a single column bus is selected by a row address line which enables all of the memory cells in the row.

The memory cells may be either of the static type, usually comprised of cross coupled transistor stages where one or more paths to ground can be selectively switched on or off, or dynamic type where a charge is stored on a capacitor by the operation of one or more transistors. In accessing or reading the static type cells, it has heretofore been necessary to permit the column bus to be discharged substantially to ground by currents passing through the memory cells in order to detect a logic "0" stored in the cell. Because of the high capacitance of the column bus, this has resulted in a relatively long time period before the column bus is discharged sufficiently for valid data to be read from the cell. In the systems using dynamic memory cells which require destructive read cycles, data is read from the memory cell by detecting a voltage kick on the column bus as the capacitor of the memory cell is either charged or discharged when addressed. Because of the relatively small capacitance of the cells compared to the capacitance of the column bus, the voltage swing is usually very small. Detecting the small voltage swing represents a serious problem in designing a sense amplifier circuit which functions reliably.

The present invention is concerned with an improved sense amplifier which can be used to detect a very small voltage swing on a column bus, thus either greatly reducing the time period required to read valid data from a static type memory cell, or more reliably reading data from dynamic type memory cells. The invention also contemplates methods for reading data from storage cells by sensing current flow through the column bus rather than a substantial change in voltage level of the column bus.

More specifically, the present invention is concerned with an amplifier comprised of an FET transistor operated with the source node connected to the column bus, the gate node connected to a reference voltage, and the drain forming the output node and being connected through an impedance to the drain supply voltage. The reference voltage on the gate node is selected such that the column bus is at a voltage below the output node as a result of the threshold drop of the transistor. For example, the reference voltage may be the drain voltage supply when a depletion mode transistor is used as the impedance. The output node has a relatively small capacitance as compared to the column bus. As a result of the high gain of the transistor which has a high width-to-length ratio, a slight change in the voltage of the column bus and thus a slight change in the gate-to-source voltage causes the transistor to conduct significant current, thus discharging the relatively small capacitance of the output node at a much greater rate than the relatively large capacitance of the column bus. Since the time required to discharge a capacitance with a given current flow is directly related to the size of the capacitance, the small capacitance of the output node permits valid data to appear on the node very rapidly. In accordance with another aspect of the present invention, the cycle time of the memory is significantly reduced because the column bus is not allowed to discharge significantly more than the minimum required to read valid data, thus minimizing the time required to charge the column bus back to the level at the start of a read cycle. The invention is also concerned with the combination of the novel sense amplifier with other circuitry in memory systems using both static and destructive read dynamic type cells.

The novel features believed characteristic of this invention are set forth in the appended claims. The invention itself, however, as well as other objects and advantages thereof, may best be understood by reference to the following detailed description of illustrated embodiments, read in conjunction with the accompanying drawings:

Figure 1:
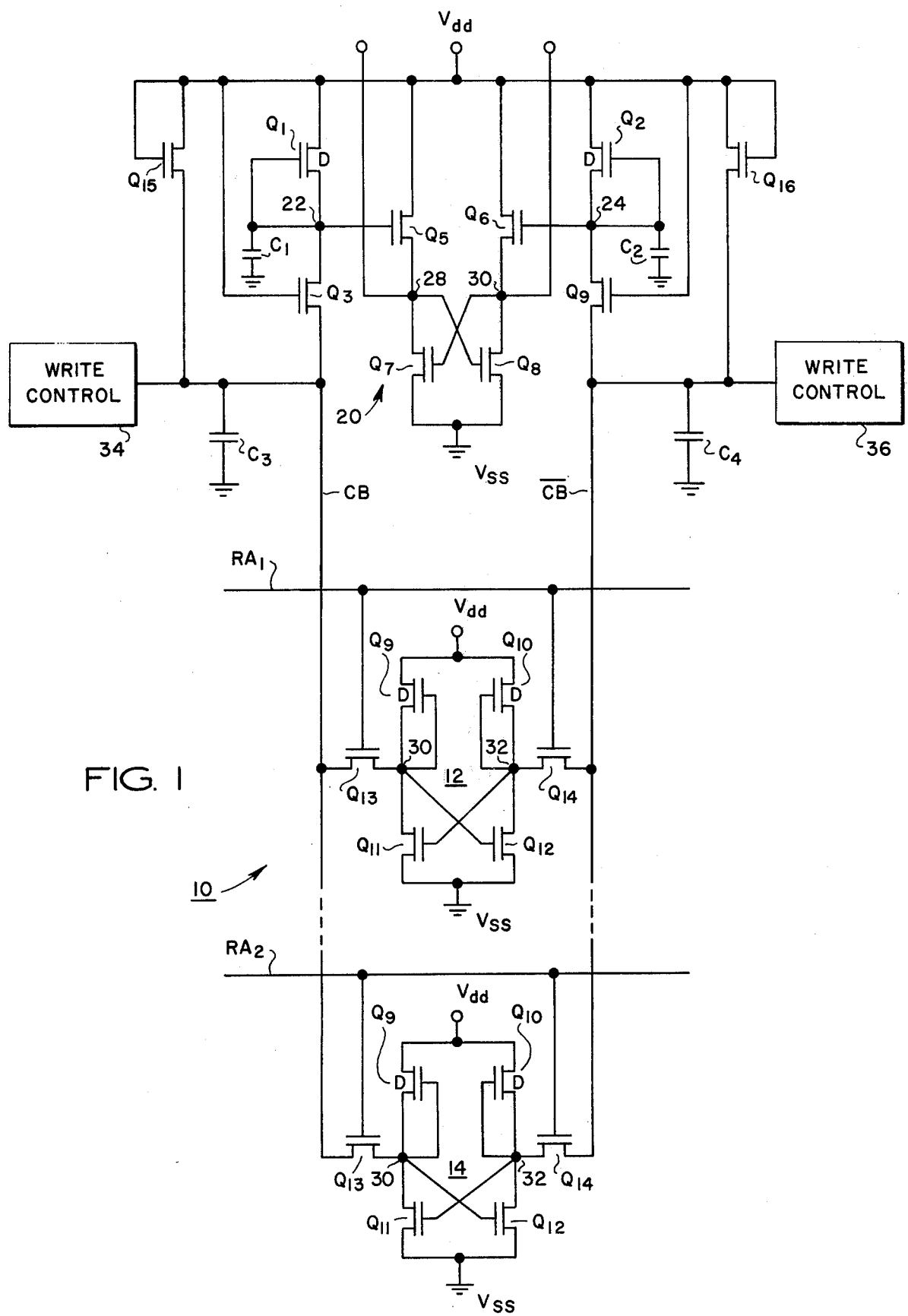
FIG. 1 is a schematic circuit diagram of a portion of a random access memory utilizing circuitry in accordance with the present invention.

Referring now to the drawings, a circuit in accordance with the present invention is indicated generally by the reference numeral 10. The circuit 10 is a portion of a random access memory of the type which is normally fabricated on a single large scale integrated circuit utilizing conventional MISFET technology. The circuit includes two conventional static memory cells 12 and 14 which are part of an array of many such cells arranged in rows and columns in the conventional manner. The cells 12 and 14 are disposed in the same column and accordingly are connected to complementary column buses CB and $\overline{CB}$. Since the cells 12 and 14 are disposed in separate rows, the cells are addressed, i.e., enabled, by separate row lines $RA_1$ and $RA_2$, respectively. The row address line $RA_1$ enables all of the memory cells in one row, while address line $RA_2$ enables all of the memory cells in a second row.

A complementary sense amplifier and level shifter is indicated generally by the reference numeral 20 and is connected to the column buses CB and $\overline{CB}$. The sense amp is comprised of depletion mode transistors $Q_1$ and $Q_2$ which connect a voltage source $V_{dd}$ to amplifier output nodes 22 and 24 respectively. The gates of transistors $Q_1$ and $Q_2$ are connected to the source nodes of the respective transistors so as to function essentially as load resistors. The channels of relatively large enhancement mode transistors $Q_3$ and $Q_4$ connect output nodes 22 and 24 to column buses CB and $\overline{CB}$, respectively. The stray capacitance of output nodes 22 and 24 are represented by capacitors $C_1$ and $C_2$ and are kept as small as practical while the capacitance of the column buses CB and $\overline{CB}$ are represented by capacitors $C_3$ and $C_4$, respectively, which are inherently large when compared to capacitor $C_1$ and $C_2$.

Output nodes 22 and 24 are also the gate of enhancement mode transistors $Q_5$ and $Q_6$ of a level shift circuit which also includes transistors $Q_7$ and $Q_8$. It will be noted that transistors $Q_5$ and $Q_7$ are connected as a stage in series between the drain supply voltage $V_{dd}$ and the source supply voltage $V_{ss}$ and that transistors $Q_6$ and $Q_8$ are similarly connected as a stage in series between the drain and source supply voltages. Node 28 between transistors $Q_5$ and $Q_7$ is connected to the gate of transistor $Q_8$, while node 30 between transistors $Q_6$ and $Q_8$ is connected to the gate of transistor $Q_7$. Nodes 28 and 30 are also the true and complement outputs, respectively, of the amplifier and level shift circuit 20 and are applied to output circuitry for the integrated circuit.

Each of the memory cells 12 and 14 is comprised of depletion mode transistors $Q_9$ and $Q_{10}$ and enhancement mode transistors $Q_{11}$ and $Q_{12}$. Transistors $Q_9$ $Q_{11}$ are connected as a stage between the drain voltage $V_{dd}$ and source voltage $V_{ss}$ as are transistors $Q_{10}$ and $Q_{12}$. The sources of the depletion mode transistors $Q_9$ and $Q_{10}$ are coupled back to the gates so that the transistors function essentially as load resistors. Nodes 30 and 32 are cross coupled to the gates of transistors $Q_{12}$ and $Q_{11}$, respectively, and are connected by enabling transistors $Q_{13}$ and $Q_{14}$ to the column buses CB and $\overline{CB}$, respectively. The gates of transistors $Q_{13}$ and $Q_{14}$ are connected to the respective row address lines $RA_1$, $RA_2$, etc.

Enhancement mode transistors $Q_{15}$ and $Q_{16}$ interconnect $V_{dd}$ and the column buses CB and $\overline{CB}$, respectively. The gates of transistors $Q_{15}$ and $Q_{16}$ are also connected to the drain supply voltage $V_{dd}$. Transistors $Q_{15}$ $Q_{16}$ are small as compared to transistors $Q_3$ and $Q_4$, for example about 1:10, and are provided to prevent the column buses CB and $\overline{CB}$ from discharging below a minimum voltage level as will hereafter be described. WRITE control circuits 34 and 36 are connected to drive the column buses CB and $\overline{CB}$, respectively, during a WRITE cycle as will hereafter be described. Column enable means (not illustrated) may be provided to connect different pairs of column buses to a single sense amp, or a separate sense amp may be provided for each pair of column buses.

To understand the operation of the circuit of FIG. 1, assume that the row address lines $RA_1$, $RA_2$, etc. are all low so that all of the enabling transistors $Q_{13}$ and $Q_{14}$ of the memory cells connected to the column buses are turned off. This allows the column buses CB and $\overline{CB}$ to assume a voltage level of $V_{dd}$ less one threshold because there are no current paths to the source voltage $V_{ss}$. In a typical circuit, $V_{dd}$ may be 5 volts and the threshold may be about 2.5 volts, in which case the column buses CB and $\overline{CB}$ would be about 2.5 volts. In this state, no current is flowing through the column buses CB and $\overline{CB}$ because each is an open circuit in the absence of a current path through an enabled cell. As a result, amplifier output nodes 22 and 24 are both at a voltage substantially equal to $V_{dd}$ because depletion mode transistors $Q_1$ and $Q_2$ function as resistors.

Assume that a logic 0 has been stored in memory cell 12 so that transistor $Q_{11}$ is turned on and node 30 is substantially at $V_{ss}$ and that transistor $Q_{12}$ is turned off and node 32 is substantially at $V_{dd}$. Then when row address line $RA_1$ goes high, memory cell 12 is enabled as transistors $Q_{13}$ and $Q_{14}$ turn on. This results in a current path from $V_{dd}$ through transistors $Q_1$ and $Q_3$, as well as a small current through $Q_{15}$, column bus CB and transistors $Q_{13}$ and $Q_{11}$ to $V_{ss}$. As soon as the voltage of the column bus CB drops a small amount, transistor $Q_3$ begins to conduct current at a relatively high rate because of its relatively large size. As a result the capacitance $C_1$ of node 22, which is charged to about 5 volts, begins to discharge very rapidly because of its small size as compared to the column bus CB which has a relatively large capacitance $C_3$. As a result, the voltage of column bus CB drops only from about 2.5 volts to about 2.35 volts while amplifier output node 22 drops from about 5.0 volts to about 2.5 volts. On the other hand, transistor $Q_{12}$ is turned off so that no current path is established from column bus $\overline{CB}$ to ground. As a result, node 24 remains substantially at $V_{dd}$, or 5 volts.

Transistors $Q_{15}$ prevents the column bus from going substantially below about 2.35 volts in order to minimize the cycle time which would otherwise be required to recharge the column bus CB between successive read cycles.

If, on the other hand, a logic "1" is stored in the address memory cell 12, transistor $Q_{11}$ is turned off and transistor $Q_{12}$ is turned on. Current through column bus $\overline{CB}$ then causes node 24 to decrease from about 5 volts to about 2.5 volts, while the voltage of column bus CB and node 22 remains at the precharge level of 5.0 volts.

It will be noted that the amplifier output nodes 22 and 24 swing between 5.0 volts and 2.5 volts. It is desirable to shift the voltage swing toward $V_{ss}$ for further processing. As a result of approximately 2.5 volts at node 22 and 5 volts at node 24, node 28 goes substantially to $V_{ss}$ as a result of the threshold drop across transistor $Q_5$, thus tending to turn transistor $Q_8$ off. This allows node 30 to approach 2.5 volts thereby maintaining transistor $Q_7$ conductive and holding node 28 near $V_{ss}$. Thus a voltage level on node 22 of about 2.5 volts results in a voltage level on output node 28 near $V_{ss}$, while the level of node 24 is shifted from 5 volts down to about 2.5 volts on node 30. Of course, the voltage levels on nodes 28 and 30 are shifted in the opposite manner when the voltage levels on the amplifier output nodes are reversed.

Write controls 34 and 36 selectively cause one of the column buses CB to go to a lower voltage level than the other column bus $\overline{CB}$ to write a logic 1 in an enabled memory cell, or column bus $\overline{CB}$ to go lower than column bus CB to write a logic 0 in the enabled cell. The write circuits may be of any suitable conventional design.

Figure 2:
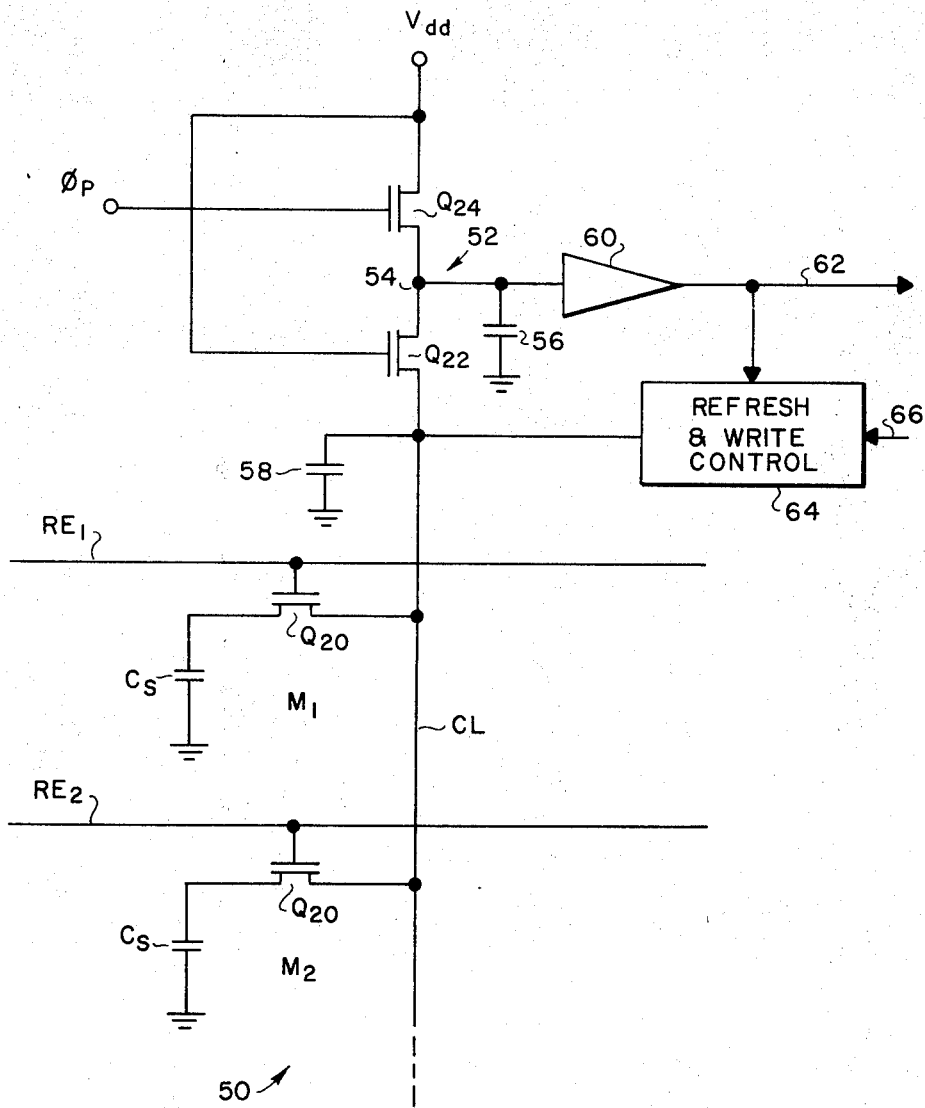
FIG. 2 is a schematic circuit diagram of a portion of a dynamic random access memory employing circuitry in accordance with the present invention.

A portion of another random access memory circuit embodying the present invention is indicated generally by the reference numeral 50 in FIG. 2. Circuit 50 has a plurality of dynamic, destructive read-out storage cells arrayed in rows and columns, with only two of the memory cells $M_1$ and $M_2$ being illustrated. Each of the memory cells has a storage capacitor $C_s$ which is connected to a column line CL by an enabling transistor $Q_{20}$. The gates of all transistors $Q_{20}$ in a common row are controlled by row enable lines $RE_1$, $RE_2$, etc. This type of storage cell is well known in the art. A logic 1 is stored in cell $M_1$, for example, by bringing the row enable line $RE_1$ high to turn transistor $Q_{20}$ on and then low while the column line CL is high to turn transistor $Q_{20}$ off and trap a charge on the capacitor $C_s$. A logic 0 is stored using the same sequence except that the column line CL is low when transistor $Q_{20}$ is turned off so that no charge is trapped on the storage capacitor $C_s$.

Data is read from the memory cell $M_1$, for example, by taking the row enable line $RE_1$ high to turn transistor $Q_{20}$ on and detecting a change in the state of column line CL as a result of the state of the storage capacitor $C_s$. In most cases, the storage capacitor $C_s$ is small when compared to the capacitance of the column line CL so that the change in the voltage of the column line is very small.

In accordance with the present invention, data is read from the memory cells by detecting the current flow resulting from the charge or discharge of the storage capacitors. This is accomplished by the sense amplifier indicated generally by the reference numeral 52 and comprised of transistors $Q_{22}$ and $Q_{24}$, both of which are enhancement mode devices. The drain of transistor $Q_{24}$ is connected to $V_{dd}$ and the source and drain nodes of transistors $Q_{24}$ and $Q_{22}$, respectively, form an output node 54 for the amplifier stage. The output node 54 has a relatively small capacitance represented by the capacitor 56, and the smaller this capacitance can be made, the better the operation of the circuit. The source of transistor $Q_{22}$ is connected to the column line CL which as mentioned has a relatively large capacitance represented by capacitor 58. The gate of transistor $Q_{24}$ is connected to a precharge clock $\phi_p$ which produces a high voltage, preferably exceeding $V_{dd}$, during a precharge period to precharge node 54 to $V_{dd}$. The gate of transistor $Q_{22}$ is connected to a reference voltage, which in the present illustration may be $V_{dd}$ if the precharge clock $\phi_p$ is higher than $V_{dd}$ to ensure that node 54 approaches $V_{dd}$ during precharge. The output node 54 is connected to any suitable conventional amplifier 60 which may then output data on node 62 to other parts of the integrated circuit, or to the data output pin of the integrated circuit. A refresh and write control 64 is provided to automatically refresh the address cell with the data destructively read from the cell and to input new data applied on node 66 in the conventional manner.

It is important that capacitor 56 be relatively small as compared to capacitor 58. The storage capacitors $C_s$ should be about the same size as capacitor 56 or larger. Transistor $Q_{22}$ should be very large so as to conduct large currents as a result of relatively small changes in the source voltage, i.e., the voltage on column line CL.

In the operation of the circuit 50, the precharge clock pulse $\phi_p$ is first brought sufficiently high to cause transistor $Q_{24}$ to charge node 52 substantially to $V_{dd}$. As a result, clock line CL is charged to approximately $V_{dd}$ less one threshold because the reference voltage $V_{dd}$ is applied to gate of transistor $Q_{22}$. It will be appreciated that the column line CL is an open circuit unit a memory cell is addressed. Then the precharge clock pulse $\phi_p$ is brought low to turn transistor $Q_{24}$ off and establish very high impedance between amplifier output node 54 and $V_{dd}$. A row enable line, for example $RE_1$, is then brought high to turn transistor $Q_{20}$ of cell $M_1$ on. If a logic 1 is stored on the storage capacitor $C_s$, it will be at approximately the same voltage as the column line CL and no current will flow from the column line CL to further charge the capacitance $C_s$. However, if no charge was stored on capacitor $C_s$, representing a logic 0 state, then a small quantity of current will flow through transistor $Q_{20}$ to charge capacitor $C_s$, causing a very slight drop in the voltage of column line CL. This results in a relatively large current flow through transistor $Q_{22}$ because of the large size of the transistor. Since the capacitance 56 of the output node is very small compared to the capacitance 58 of the column line CL, a major portion of the current used to charge $C_s$ will be supplied by capacitor 56 through transistor $Q_{22}$. As a result, node 54 will have a voltage swing approaching the threshold drop of transistor $Q_{22}$, even though the voltage drop on the column bus CL may be only a small fraction of the threshold drop. The substantial voltage swing at the input of amplifier 60 is then used to produce a strong logic level at the data output 62. If a logic 0 is detected, the refresh and write control 64 automatically causes the column line CL to go to $V_{ss}$ so that the logic 0 can be restored on capacitor $C_s$ before the row enable line $RE_1$ turns transistor $Q_{20}$ off. Of course, if a logic 1 was stored, the column line CL is already at the logic 1 state.

From the above description of preferred embodiments of the invention, it will be appreciated that a unique sense amplifier has been described for use in random access memories. The amplifier permits the system to function with minimum voltage swing which eliminates problems normally encountered with rapid changes in row addresses. The system utilizes a common gate stage which drives a common drain stage, thus eliminating any possible Miller Effect which tends to slow access. The sense amplifier is useful for reading data from static type memory cells by sensing the presence or absence of current flow. By sensing current flow, valid data can be read very rapidly because it is not necessary to substantially discharge a high capacitance column line in order to detect the current flow. An invention may be used in differential form with a unique level shift circuit. The cycle time of the memory is also reduced by preventing the voltage on the column line from decreasing below a minimum value, thus ensuring that the column line will not have to be recharged before another read cycle can begin. The unique level shift circuit consumes a minimum power.

The amplifier in accordance with the present invention is also useful to read data from destructive readout dynamic memory cells where current flows only for a brief instance when a cell is addressed. By properly sizing the capacitive value of the output node of the amplifier as compared to the capacity value of the memory cell, the small current flow required to charge the memory cell can be detected reliably.

Although preferred embodiments of the invention have been described in detail, it is to be understood that various changes, substitutions, and alterations can be made therein without departing from the spirit and scope of the invention as defined by the appended claims.

What is claimed is:

1. In an MOS integrated circuit memory having drain supply voltage means and source supply voltage means, the combination of:
    a column bus having a relatively high capacitance;
    a plurality of memory cells each having a data output connected to the column bus, each memory cell having a high impedance between the column bus and a source supply voltage when addressed to represent one logic state and a lower impedance for conducting at least some current to the source supply voltage when addressed to represent another logic state;
    an output node having a relatively small capacitance when compared to the capacitance of the column bus;

an enhancement mode field effect transistor the channel of which connects the output node to the column bus;

impedance means connecting the drain supply voltage means to the output node for charging the output node to a first voltage;

means for applying a reference voltage to the gate of the transistor that is not substantially higher than the first voltage such that the column bus will be charged through the transistor to a voltage lower than that of the output node as a result of the threshold drop of the transistor; and means for enabling a selected memory cell to cause the cell to sink current if said another logic state is stored therein to thereby cause discharge of the relatively small capacitance of the output node at a greater rate than the relatively large capacitance of the column bus as a result of the gain of the transistor to produce a larger voltage swing on the output node than on the column bus.

2. The combination of claim 1 wherein the impedance means comprises a depletion mode transistor the drain node of which is connected to the drain voltage supply means, the depletion mode transistor having electrically common gate and source nodes, and wherein the means for applying a reference voltage to the gate of the enhancement mode transistor comprises a conductor continuously connecting the gate to the drain supply voltage means.

3. The combination of claim 2 wherein the storage cell provides a d.c. current path from the column bus to a source supply voltage means for said another logic state.

4. The combination of claim 1 wherein the impedance means comprises a transistor the gate of which is connected to precharge signal means which turns the transistor on before a read cycle and off while data is being read and output, and the storage cell conducts current only as a result of capacitive coupling between the column bus and the source supply voltage.

5. The combination of claim 1 wherein each storage cell has complementary data input-output nodes providing one impedance d.c. current path and one higher impedance current path for each logic state, and further comprising a complementary column bus connected to the complementary input-output nodes of the storage cells, a complementary output node having a relatively small capacitance when compared to the capacitance of the column bus;

a complementary enhancement mode field effect transistor the channel of which connects the complementary output node to the complementary column bus, impedance means for charging the complementary output node to the first voltage, and means for applying the reference voltage to the gate of the complementary transistor.

6. The combination of claim 5 further characterized by a level shift network comprising cross coupled true and complement stages each comprised of first and second transistors connected in series between the drain supply voltage means and the source supply voltage means, the drain node of each of the first transistors being connected to the drain supply voltage means, the source node of each of the second transistors being connected to the source supply voltage means, and the source node of each of the first transistors and the gate nodes of each of the second transistors being common and forming true and complement data output for the respective stages, the data outputs being cross coupled to the gate nodes of the second transistor of the other stage, and the gates of the first transistors of the true and complement stages being connected to the respective true and complement output nodes defined in claim 5.

7. In an integrated MOS circuit memory having drain voltage supply means and source voltage supply means, the sense amplifier for amplifying a relatively small voltage swing on a column bus having a relatively large capacitance produced by current flow into a memory cell connected to the column bus comprising:

an output node having a relatively small capacitance when compared to that of the column bus;

a field effect transistor the channel of which connects the output node to the column bus;

impedance means for interconnecting the output node and a drain voltage supply means; and means for applying a reference voltage to the gate of the transistor having a level such that the voltage of the output node will be higher than that of the column bus in the absence of current flow through the column bus because of the threshold drop of the transistor.

8. In a random access memory, the method of reading data from a memory cell which conducts current in response to an enabling address signal to represent one logic state and does not conduct current to represent the other logic state, the cell being connected through a column bus having a relatively large capacitance and an enhancement mode field effect transistor to an output node having a relatively small capacitance which comprises applying a reference voltage to the gate of the transistor while precharging the output node and thus the column bus through the transistor to a voltage such that the output node is at a higher voltage level than the column bus as a result of the threshold drop of the transistor and then enabling the memory cell to conduct current from the column bus when the enabled memory cell conducts current whereby the transistor will be turned on to rapidly substantially equalize the voltages of the output node and the column bus, and detecting the larger decrease in the voltage of the output node as an indication of the said one logic level stored in the enabled memory cell.

9. The method of claim 8 wherein the memory cell provides a d.c. current path to ground when storing said one logic level and additional current is applied to the column bus other than that passing through the transistor to limit the level to which the voltage of the column bus falls as a result of conductance of the memory cell.

10. The method of claim 8 applied to a memory cell which conducts current only momentarily as a result of capacitive coupling.

11. In an integrated MOS circuit memory, the sense amplifier for amplifying a relatively small voltage swing on a column bus having a relatively large capacitance produced by current flow into a memory cell connected to the column bus and having a d.c. current path to the source supply voltage when storing one logic level comprising:

an output node having a relatively small capacitance when compared to that of the column bus;

an enhancement mode transistor the channel of which connects the output node to the column bus;

means interconnecting the output node and a drain voltage supply for charging the output node and thus the column bus through the enhancement mode transistor; and means applying a reference voltage to the gate of the enhancement mode transistor having a voltage level such that the voltage of the output node will be higher than that of the column bus in the absence of current flow through a memory cell.

12. The sense amplifier of claim 11 wherein:

the means interconnecting the output node and a drain voltage supply comprises a depletion mode transistor the gate of which is connected to the output node; and the means applying the reference voltage to the gate of the enhancement mode transistor comprises a conductor for applying the drain supply voltage to the gate of the enhancement mode transistor.

13. The sense amplifier of claim 11 further characterized by a second enhancement mode transistor the channel of which interconnects the drain supply voltage and the column bus and the gate of which is connected to the drain supply voltage, the second enhancement mode transistor being substantially smaller than the first mentioned enhancement mode transistor.

14. The method for reading data from a static memory cell of an integrated circuit memory having a d.c. current path from a sense bus to a source supply voltage means when addressed representing one logic state which comprises precharging the sense bus to a predetermined voltage level, then addressing the memory cell to initiate the d.c. current path, and detecting the current flow through the sense bus before the voltage of the sense bus has been substantially reduced and supplying additional current to the sense bus to prevent excessive discharge of the bus.

15. The method of claim 14 wherein the current flow is detected by precharging the sense bus through an output node and enhancement mode transistor having a gate voltage relative to the voltage on the output node that is such that the voltage of the output node is higher than the voltage of the sense bus due to the threshold drop across the transistor, and then detecting a drop in the voltage of the output node to detect the flow of current through the sense bus.

* * * * *

UNITED STATES PATENT AND TRADEMARK OFFICE
CERTIFICATE OF CORRECTION

PATENT NO. : 3,967,252
DATED : June 29, 1976
INVENTOR(S) : Robert Murray Donnelly It is certified that error appears in the above-identified patent and that said Letters Patent are hereby corrected as shown below:

Col. 1, line 10, "randon" should be —random—.

Col. 3, line 20, between "$Q_9$ $Q_{11}$" insert —and—.

Col. 3, line 36, between "$Q_{15}$ $Q_{16}$" insert —and—.

Col. 4, line 46, 1 should be —"1"—.

Col. 4, line 48, 0 should be —"0"—.

Col. 4, line 61, 1 should be —"1"—.

Col. 4, line 65, 0 should be —"0"—.

Col. 5, line 49, "clock" should be —column—.

Col. 5, line 58, 1 should be —"1"—.

Col. 5, line 63, 0 should be —"0"—.

Col. 6, line 10, 0 should be —"0"—.

Col. 6, line 12, 0 should be —"0"—.

Col. 6, line 14, 1 should be —"1"—.

UNITED STATES PATENT OFFICE

CERTIFICATE OF CORRECTION

Patent No. 3,967,252  Dated  June 29, 1976

Inventor(s) Robert Murray Donnelly

It is certified that error appears in the above-identified patent and that said Letters Patent are hereby corrected as shown below:

Column 6, line 15, 1 should be -- "1" --.

Signed and Sealed this

Sixth Day of September 1977

[SEAL]

Attest:

RUTH C. MASON
*Attesting Officer*

LUTRELLE F. PARKER
*Acting Commissioner of Patents and Trademarks*